(12) United States Patent
Nishimura et al.

(10) Patent No.: US 10,927,454 B2
(45) Date of Patent: Feb. 23, 2021

(54) METHOD OF FORMING NITRIDE FILM

(71) Applicants: Toshiba Mitsubishi-Electric Industrial Systems Corporation, Chuo-ku (JP); Tohoku University, Sendai (JP)

(72) Inventors: Shinichi Nishimura, Tokyo (JP); Kensuke Watanabe, Tokyo (JP); Yoshihito Yamada, Tokyo (JP); Akinobu Teramoto, Miyagi (JP); Tomoyuki Suwa, Miyagi (JP); Yoshinobu Shiba, Miyagi (JP)

(73) Assignees: Toshiba Mitsubishi-Electric Industrial Systems Corporation, Chuo-ku (JP); Tohoku University, Sendai (JP)

( * ) Notice: Subject to any disclaimer, the term of this patent is extended or adjusted under 35 U.S.C. 154(b) by 0 days.

(21) Appl. No.: 16/480,942

(22) PCT Filed: Feb. 14, 2017

(86) PCT No.: PCT/JP2017/005289
§ 371 (c)(1),
(2) Date: Jul. 25, 2019

(87) PCT Pub. No.: WO2018/150452
PCT Pub. Date: Aug. 23, 2018

(65) Prior Publication Data
US 2019/0390332 A1     Dec. 26, 2019

(51) Int. Cl.
*H01L 21/00*     (2006.01)
*C23C 16/46*     (2006.01)
(Continued)

(52) U.S. Cl.
CPC ............ *C23C 16/345* (2013.01); *C23C 16/46* (2013.01); *C23C 16/503* (2013.01);
(Continued)

(58) Field of Classification Search
CPC ..... C23C 16/345; C23C 16/503; C23C 16/46; C23C 16/402; C23C 16/4412;
(Continued)

(56) References Cited

U.S. PATENT DOCUMENTS 4,664,747 A     5/1987 Sekiguchi et al.
5,582,880 A     12/1996 Mochizuki et al.
(Continued)

FOREIGN PATENT DOCUMENTS

EP     1 693 889 A2     8/2006
JP     61-222534 A     10/1986
(Continued)

OTHER PUBLICATIONS

Wyller et al, "Thermal Decomposition of Monosilane Observed in a Free Space Reactor", 2016, 32nd European Photovoltaic Solar Energy Conference and Exhibition, pp. 294-299, published on Aug. 17, 2017.*
(Continued)

*Primary Examiner* — Nikolay K Yushin
(74) *Attorney, Agent, or Firm* — Oblon, McClelland, Maier & Neustadt, L.L.P.

(57) ABSTRACT

A method of forming a nitride film wherein (a) a silane-based gas is supplied to a processing chamber through a gas supply port; (b) a nitrogen radical gas from a radical generator is supplied to the processing chamber through a radical gas pass-through port; and (c) the silane-based gas supplied in (a) is reacted with the nitrogen radical gas supplied in (b), without causing a plasma phenomenon in the processing chamber, to form a nitride film on a wafer.

4 Claims, 4 Drawing Sheets

(51) Int. Cl.
*C23C 16/34* (2006.01)
*C23C 16/503* (2006.01)
*H01L 21/02* (2006.01)

(52) U.S. Cl.
CPC .... *H01L 21/0217* (2013.01); *H01L 21/02211* (2013.01); *H01L 21/02271* (2013.01)

(58) Field of Classification Search
CPC ..... C23C 16/56; C23C 16/44; C23C 16/4408; C23C 16/452; H01L 21/02271; H01L 21/318; H01L 21/02211; H01L 21/0217; H01L 21/0262; H01L 21/0242; H01L 21/02458; H01L 21/0254
See application file for complete search history.

(56) References Cited

U.S. PATENT DOCUMENTS

| | | | | |
|---|---|---|---|---|
| 7,416,978 | B2* | 8/2008 | Hasebe | C23C 16/52 257/E21.17 |
| 2015/0167171 | A1* | 6/2015 | Hasebe | C23C 16/511 427/575 |

FOREIGN PATENT DOCUMENTS

| | | |
|---|---|---|
| JP | 04-136171 A | 5/1992 |
| JP | 5-275346 A | 10/1993 |
| JP | 07-014826 A | 1/1995 |
| JP | 2005-93737 A | 4/2005 |
| JP | 2008-117878 A | 5/2008 |
| JP | 2013-8794 A | 1/2013 |
| JP | 2015-5780 A | 1/2015 |
| JP | 2015-119025 A | 6/2015 |
| KR | 10-2015-0071659 A | 6/2015 |
| TW | 201439105 A | 10/2014 |

OTHER PUBLICATIONS

Swihart et al., "On the Mechanism of Homogeneous Decomposition of the Chlorinated Silanes. Chain Reactions Propagated by Divalent Silicon Species", 1998, J. Phys. Chem. A 1998, 102, pp. 1542-1549. Dec. 1998.*

International Preliminary Report on Patentability and Written Opinion dated Aug. 29, 2019 in PCT/JP2017/005289 (with English translation), 20 pages.

International Search Report dated Apr. 25, 2017 in PCT/JP2017/005289 filed on Feb. 14, 2017.

Office Action dated Sep. 19, 2018 in Taiwanese Patent Application No. 106114470 (with partial unedited computer-generated English translation), citing documents AT and AU therein.

Dun, H. et al., "Mechanisms of Plasma-Enhanced Silicon Nitride Deposition Using $SiH_4/N_2$ Mixture," Journal of the Electrochemical Society, vol. 128, No. 7, Jul. 1981, p. 1555-1563.

Office Action dated Apr. 21, 2020 in corresponding Japanese Patent Application No. 2019-500060 (with English Translation), 6 pages.

Notification of Reason for Refusal dated Aug. 26, 2020 in Korean Patent Application No. 10-2019-7023474 (with unedited computer generated English translation), citing document AO therein, 10 pages.

Office Action dated Dec. 1, 2020, in Japanese Patent Application No. 2019-500060, with English-language Translation.

T. R. Hogness, et al., "The Thermal Decomposition of Silane", Journal of the American Chemical Society, vol. 58. No. 1, Jan. 1, 1936, pp. 108-112.

* cited by examiner

| PROCESSING CONDITIONS | | SILANE-BASED GAS FLOW RATE | NITROGEN GAS FLOW RATE | HYDROGEN GAS FLOW RATE | STAGE TEMPERATURE | PROCESSING CHAMBER PRESSURE | RADICAL GENERATOR POWER | PROCESSING TIME |
|---|---|---|---|---|---|---|---|---|
| 1A | FIRST EMBODIMENT DISILANE | 0.5sccm | 1slm | — | 400°C | 133Pa | 100W | 105 minutes |
| 2A | SECOND EMBODIMENT MONOSILANE | 0.5sccm | 1slm | 10sccm | 400°C | 133Pa | 100W | 65 minutes |
| 2B | SECOND EMBODIMENT MONOSILANE | 15sccm | 1slm | 5sccm | 400°C | 133Pa | 100W | 90 minutes |

FIG. 5

| PROCESSING CONDITIONS | | FILM THICKNESS | FILM FORMATION RATE | REFRACTION INDEX |
|---|---|---|---|---|
| 1A | FIRST EMBODIMENT DISILANE | ABOUT 10 nm | 0.095nm/min | 2.122 |
| 2A | SECOND EMBODIMENT MONOSILANE | ABOUT 10 nm | 0.154nm/min | 2.073 |
| 2B | SECOND EMBODIMENT MONOSILANE | ABOUT 10 nm | 0.117nm/min | 1.903 |

FIG. 6

METHOD OF FORMING NITRIDE FILM

TECHNICAL FIELD

The present invention relates to a method of forming a nitride film such as a silicon nitride film.

BACKGROUND ART

Nitride films are used for semiconductors and various other applications, and especially in the semiconductor field, silicon nitride films are used, in addition to as gate insulating films, as barrier films between metal and other films and various films. As to the reason for such use, when silicon nitride films are used as gate insulating films, they are superior in insulating performance to oxide films that have heretofore mainly been used, and when they are used as barrier films, they are good in resistance against etching and are less prone to be dispersed in metal, that is, they are characteristic in having advantages in production steps, and therefore they are widely used.

When a silicon nitride film is formed on a substrate, a thermal CVD (Chemical Vapor Deposition) apparatus, a photo CVD apparatus, a plasma CVD apparatus, a thermal ALD (Atomic Layer Deposition) apparatus, or a plasma ALD apparatus is used. Especially, plasma CVD and plasma ALD apparatuses are often used. For example, as compared with a thermal and photo CVD apparatus and a thermal and photo ALD apparatus, plasma CVD and plasma ALD apparatuses are advantageous in that they can lower the film formation temperature and they are higher in film formation speed, so that film formation processing can be performed in a shorter time.

Conventional technologies adopting a thermal nitridation method of forming a nitride film by thermal nitridation include, for example, the method of manufacturing a semiconductor device disclosed in Patent Document 1, and conventional technologies adopting a plasma nitridation method of forming a nitride film using plasma processing include, for example, the plasma processing apparatus disclosed in Patent Document 2.

PRIOR ART DOCUMENTS

Patent Documents

Patent Document 1: Japanese Patent Application Laid-Open No. 2013-8794
Patent Document 2: Japanese Patent Application Laid-Open No. 2015-5780

SUMMARY

Problem to be Solved by the Invention

In the case of forming a silicon nitride film on a substrate on which a nitride film is to be formed, a method of supplying a silane-based gas (a gas composed of a compound containing silicon and hydrogen) and a nitridation source to a processing chamber to form a nitride film has commonly been employed.

As described above, the methods of forming a nitride film include a thermal nitridation method by thermal processing (Patent Document 1), a plasma nitridation method using plasma (Patent Document 2), and the like.

However, in the case of forming a nitride film using the thermal nitridation method, it is necessary to set the temperature of a wafer serving as a substrate on which a nitride film is to be formed or the processing temperature to a high temperature of about 800° C., and there is a high possibility that the device characteristics of the nitride film or the film formed in the previous step will be degraded by heat. Therefore, there is a problem that it is impossible to form any high-quality nitride film without damaging a wafer including a film formed in the previous step.

On the other hand, in the case of forming a nitride film using the plasma nitridation method, since a processing temperature is set to about 500° C. and plasma is generated near a substrate on which a nitride film is to be formed, there is a high possibility that the substrate may be damaged by plasma or ions and damages may be accumulated on the substrate though substances react just near the substrate to form a high-quality nitride film. For this reason, as in the thermal nitridation method, there is a problem that it is impossible to form any high-quality nitride film without damaging the substrate on which a nitride film is to be formed.

As described above, there is a problem that it is impossible to avoid providing some damages due to heat or plasma to substrates during production even if any of the thermal nitridation method and the plasma nitridation method that are conventional methods of forming a nitride film is used.

It has conventionally been common to form a nitride film using a gas such as ammonia gas as a nitridation source. However, use of ammonia as the nitridation source is problematic in that the ratio of nitrogen atoms to hydrogen atoms is fixed and, therefore, ammonia cannot be used in the step where it is not desirable to use hydrogen molecules, and even if the amount of hydrogen is desired to be controlled, the amount of hydrogen cannot be increased or decreased.

It is an object of the present invention to solve the above-described problems and provide a method of forming a nitride film capable of forming a high-quality nitride film on a substrate on which a nitride film is to be formed without damaging the substrate.

Means to Solve the Problem

A method of forming a nitride film described in Claim 1 according to the present invention is a method of forming a nitride film on a substrate disposed in a processing chamber, the method comprising (a) a step of supplying a silane-based gas to the processing chamber; (b) a step of supplying a nitrogen radical gas to the processing chamber; and (c) a step of reacting the silane-based gas supplied in the step (a) with the nitrogen radical gas supplied in the step (b) without causing any plasma phenomenon in the processing chamber to form a nitride film on the substrate.

Effects of the Invention

According to the method of forming a nitride film in the present invention, it is possible to form a nitride film on a substrate in the step (c) without causing any plasma phenomenon in a processing chamber, so that it is possible to form a high-quality nitride film while avoiding damages to the substrate due to the plasma phenomenon during performing the step (c).

Furthermore, a highly-reactive nitrogen radical gas is supplied to the processing chamber in the step (b), so that it is possible to form a nitride film on the substrate without using the thermal nitridation method performed at a high temperature of about 800° C. Therefore, it is possible to form a high-quality nitride film while avoiding, during performing the step (c), the phenomenon where the device characteristics of the nitride film or the film formed in the previous step are degraded by heat.

The objects, features, aspects, and advantages of the present invention will become more apparent from the following detailed description and the accompanying drawings.

DESCRIPTION OF EMBODIMENTS

First Embodiment

Figure 1:
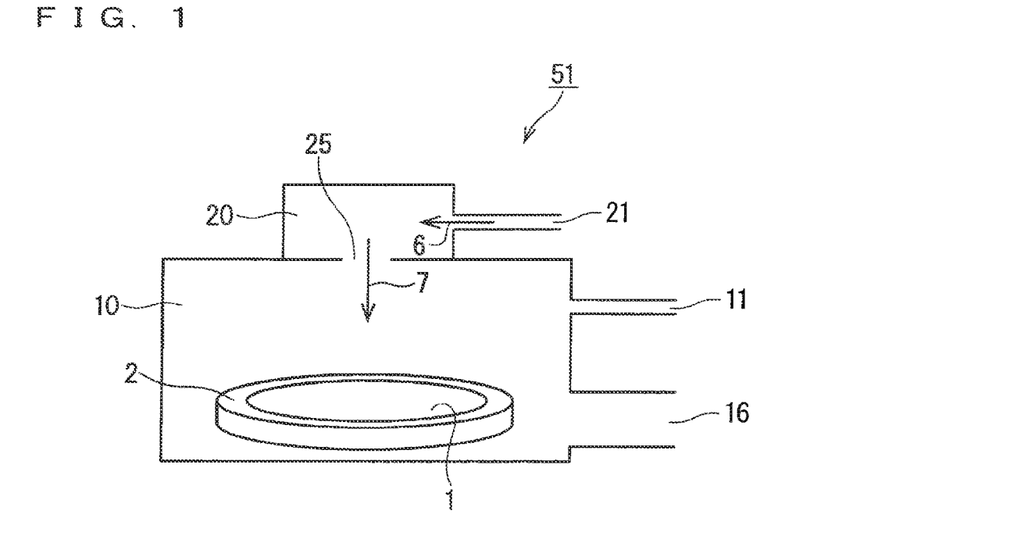
FIG. 1 is an illustration diagram showing a schematic configuration of a film formation apparatus configured to perform a method of forming a nitride film that is a first embodiment of the present invention.

FIG. 1 is an illustration diagram showing a schematic configuration of a film formation apparatus 51 configured to perform a method of forming a nitride film that is a first embodiment of the present invention.

As shown in this figure, the film formation apparatus 51 includes a processing chamber 10 and a radical generator 20, and the radical generator 20 is disposed adjacent to the upper surface of the processing chamber 10.

A wafer 1 is disposed on a wafer stage 2 placed on the bottom surface of the processing chamber 10. The wafer 1 is a substrate on which a nitride film is to be formed. The processing chamber 10 receives supply of a silane-based gas from a gas supply port 11 provided above the position of the wafer stage 2, and the gas in the processing chamber 10 is discharged through a discharge port 16 provided below the same height as the position of the wafer stage 2. The term "silane-based gas" means a gas composed of a compound containing silicon and hydrogen.

A pure nitrogen gas is supplied as a nitridation source to the radical generator 20 through the gas supply port 21. Then, the radical generator 20 activates a nitrogen gas 6 supplied using dielectric barrier discharge to generate a nitrogen radical gas 7, and supplies the nitrogen radical gas 7 into the processing chamber 10 through a radical gas pass-through port 25 provided on the lower surface (the upper surface of the processing chamber 10).

Figure 2:
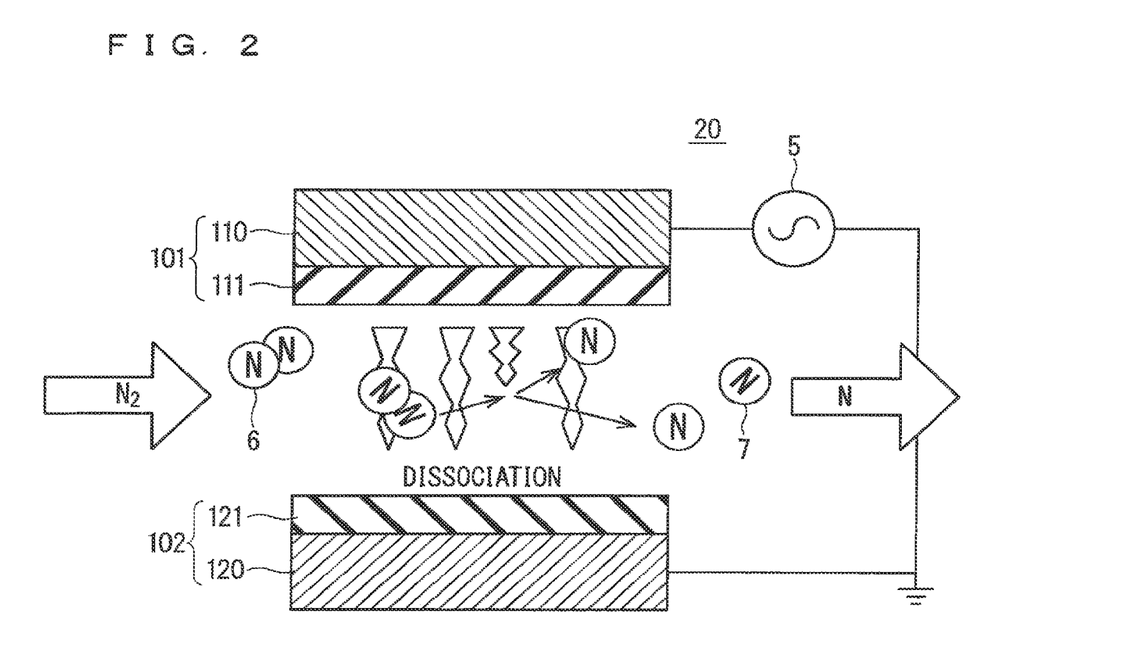
FIG. 2 is an illustration diagram schematically showing an internal configuration of the radical generator shown in FIG. 1.

FIG. 2 is an illustration diagram schematically showing an internal configuration of the radical generator 20. As shown in this figure, the configuration basically includes a high-voltage side electrode constituent part 101, a ground side electrode constituent part 102 provided below the high-voltage side electrode constituent part 101, and a high frequency power supply 5 that applies an AC voltage to the high-voltage side electrode constituent part 101 and the ground side electrode constituent part 102.

The high-voltage side electrode constituent part 101 includes a dielectric electrode 111 and a metal electrode 110 formed on the upper surface of the dielectric electrode 111, and the ground side electrode constituent part 102 includes a dielectric electrode 121 and a metal electrode 120 formed on the bottom surface of the dielectric electrode 121. The metal electrode 120 of the ground side electrode constituent part 102 is connected to the ground level, and an AC voltage is applied from the high frequency power supply 5 to the metal electrode 110 of the high-voltage side electrode constituent part 101. It is noted that the metal electrode 110 is entirely or selectively formed on the dielectric electrode 111, and the metal electrode 120 is entirely or selectively formed under the dielectric electrode 121.

By the application of the AC voltage from the high frequency power supply 5, a region including a region where the metal electrodes 110 and 120 overlap with each other in plan view is defined as a discharge space in a dielectric space where the dielectric electrodes 111 and 121 face each other. The radical generator 20 shown in FIG. 1 is configured mainly by the above-described high-voltage side electrode constituent part 101, ground side electrode constituent part 102, and high frequency power supply 5.

In the radical generator 20 having such a configuration, a discharge space is formed between the high-voltage side electrode constituent part 101 and the ground side electrode constituent part 102 by the application of the AC voltage from the high frequency power supply 5, and when the nitrogen gas 6 (nitrogen molecules) is supplied into the discharge space, nitrogen molecules are dissociated, so that the nitrogen radical gas 7 that is composed of radicalized nitrogen atoms can be obtained.

As described above, since the radical generator 20 generates the nitrogen radical gas 7 using dielectric barrier discharge, the temperature of the nitrogen radical gas 7 is inevitably raised to ambient temperature or higher and 400° C. or lower.

In such a configuration, in the method of forming a nitride film of the first embodiment, the following steps (a) to (c) are performed to form a nitride film (silicon nitride film) on the wafer 1, which is the substrate on which a nitride film is to be formed, disposed in the processing chamber 10.

The step (a) is a step of supplying the silane-based gas into the processing chamber 10 through the gas supply port 11.

The step (b) is a step of supplying the nitrogen radical gas 7 into the processing chamber 10 from the radical generator 20 through the radical gas pass-through port 25.

The step (c) is a step of reacting the silane-based gas supplied in the step (a) with the nitrogen radical gas supplied in the step (b) to form a nitride film on the wafer 1 without causing any plasma phenomenon in the processing chamber 10. The above steps (a) to (c) are simultaneously performed in most of their periods of time.

The gases supplied during performing the step (c) (the nitrogen radical gas 7, the silane-based gas, etc.) are discharged from the discharge port 16 after the reaction.

The step (b) is more specifically a step of generating the nitrogen radical gas 7 from the nitrogen gas 6 in the radical generator 20 provided adjacent to the upper surface of the processing chamber 10 separately from the processing chamber 10 and supplying the generated nitrogen radical gas 7 into the processing chamber 10.

Then, as described above, the radical generator 20 provides the nitrogen radical gas 7 by forming a discharge space between a pair of electrodes facing each other (between the electrode configuration parts 101 and 102) via the dielectric electrodes 111 and 121, applying an AC voltage from the high frequency power supply 5 to between the pair of electrodes to generate a dielectric barrier discharge in the discharge space, and allowing the nitrogen gas 6 to pass through the discharge space.

One example of a specific processing condition 1 according to the method of forming a nitride film of the first embodiment described above will be shown below.

Disilane gas flow rate: 0.5 sccm (standard cc/min),
Nitrogen gas flow rate: 1 slm (standard L/min),
Wafer stage temperature: 400° C.
Processing time: 60 min,
Processing chamber pressure: 133 Pa,
Radical generator power: 100 W.

Under the processing condition 1, disilane is used as the silane-based gas, and the supplied gas flow rates of the disilane and the nitrogen gas 6 are set as specified above. The "wafer stage temperature" means the set temperature of the wafer stage 2, the "processing time" means mainly the performing time of the step (c), the "processing chamber pressure" means the pressure in the processing chamber 10, and the "radical generator power" means the power supplied from the high frequency power supply 5. The supply amount of the nitrogen radical gas 7 can be controlled to a desired amount by changing the power (radical generator power) supplied to the radical generator 20.

By performing the processing under the above condition, an about 6 nm-thick nitride film can be formed on the surface of the wafer 1 as a result of the reaction of the silane-based gas with the nitrogen radical gas 7.

In the method of forming a nitride film according to the first embodiment, a nitride film is formed on the wafer 1 without causing any plasma phenomenon in the processing chamber 10 in the step (c), so that it is possible to form a high-quality nitride film while avoiding damages to the wafer 1 due to a plasma phenomenon during performing the step (c).

Furthermore, since the highly-reactive nitrogen radical gas 7 is introduced into the processing chamber 10 in the step (b), it is possible to form a nitride film on the wafer 1 without using the thermal nitridation method performed at a high temperature of about 800° C. Therefore, when the step (c) is performed, it is possible to form a high-quality nitride film while avoiding the phenomenon where the device characteristics related to the nitride film or the wafer 1 are deteriorated by heat. In the case where a film has already been formed in another film formation step at the time of forming the nitride film, occurrence of deterioration of the device characteristics of the other film can also be avoided.

In addition, the nitrogen radical gas 7 at ambient temperature or higher and 400° C. or lower is supplied during performing the step (c) by heating the radical generator 20 through the step (b), and the nitrogen radical gas 7 is provided with a temperature factor of, for example, 100° C. or higher and 400° C. or lower, so that the reaction between the silane-based gas and the nitrogen radical gas can be promoted, and therefore the film formation rate can be increased.

In addition, since the nitrogen radical gas 7 is obtained by generating dielectric barrier discharge in the radical generator 20, the nitrogen radical gas 7 free of ions can be stably supplied into the processing chamber 10. Therefore, since no damages are caused by an ionized gas during performing the step (c), it is possible to form a nitride film or a nitride film with better device characteristics of the film formed in the previous step.

Furthermore, when the processing condition 1 is adopted, in the step (c), the heating treatment of setting the temperature of the wafer stage 2 to 400° C. to heat the surface of the wafer 1 to a temperature equal to or higher than the temperature at which the silane-based gas decomposes into silicon and hydrogen gas is performed. Therefore, since the reaction between the silane-based gas and the nitrogen radical gas can be further promoted by the heating treatment, the film formation rate can be further increased. As a result, a high-quality nitride film can be formed in a short time. A silicon-based gas such as the silane-based gas starts to decompose at about 400° C. That is, the temperature at which the silane-based gas decomposes into silicon and a hydrogen gas is a temperature of about 400° C. Therefore, the heating temperature of the wafer stage 2 in the heating step performed in the step (c) is desirably set at about 400° C. from the viewpoint of decomposing the silane-based gas into silicon and a hydrogen gas and performing the heating treatment at a temperature as low as possible.

Even if the above processing condition 1 is adopted, the set temperature of the wafer stage 2 is about 400° C., and it is sufficiently low as compared to 800° C. that is required in the thermal nitridation method and 500° C. that is required in the plasma nitridation method, so that it is possible to minimize damages due to heat during performing of the step (c).

Second Embodiment

Figure 3:
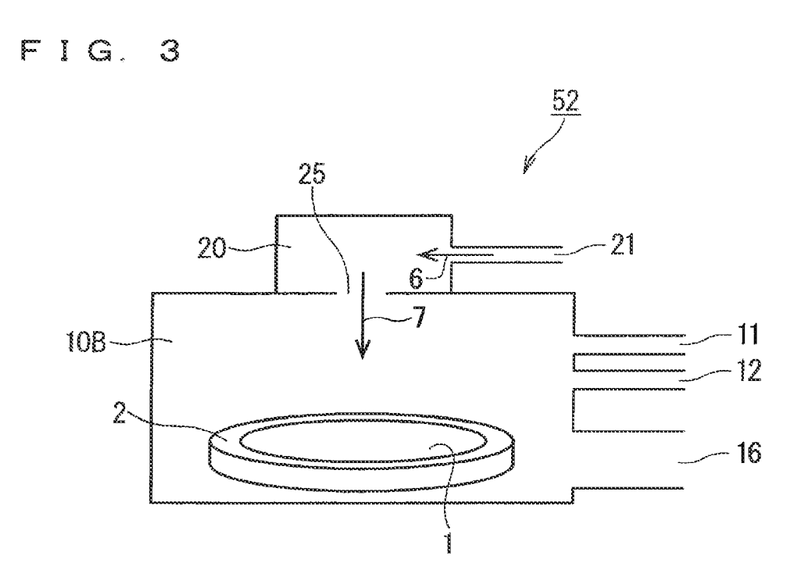
FIG. 3 is an illustration diagram showing a schematic configuration of a film formation apparatus configured to perform a method of forming a nitride film that is a second embodiment of the present invention.

FIG. 3 is an illustration diagram showing a schematic configuration of a film formation apparatus 52 configured to perform a method of forming a nitride film that is a second embodiment of the present invention.

As shown in this figure, the film formation apparatus 52 includes a processing chamber 10B and a radical generator 20, and the radical generator 20 is disposed adjacent to the upper surface of the processing chamber 10B.

A wafer 1 is disposed on a wafer stage 2 placed on the bottom surface of the processing chamber 10B. The processing chamber 10B receives a silane-based gas through a gas supply port 11 provided above the position of the wafer stage 2, and receives supply of a hydrogen gas through a gas supply port 12. On the other hand, the gas in the processing chamber 10B is discharged through a discharge port 16 provided below the same height as the position of the wafer stage 2.

The radical generator 20 has a similar configuration to that of the first embodiment, and supplies a nitrogen radical gas 7 into the processing chamber 10B through a radical gas pass-through port 25 provided on the lower surface (the upper surface of the processing chamber 10B).

In such a configuration, in the method of forming a nitride film of the second embodiment, the following steps (a), (b), (d) and (c) are performed to form a nitride film (silicon nitride film) on the wafer 1, which is a substrate on which a nitride film is to be formed, disposed in the processing chamber 10B.

The step (a) is a step of supplying the silane-based gas into the processing chamber 10B through the gas supply port 11.

The step (b) is a step of supplying the nitrogen radical gas 7 into the processing chamber 10B from the radical generator 20 through the radical gas pass-through port 25.

The step (d) is a step of supplying a hydrogen gas into the processing chamber 10B through the gas supply port 12.

The step (c) is a step of reacting the silane-based gas supplied in the step (a) with the nitrogen radical gas supplied in the step (b) to form a nitride film on the wafer 1 without causing any plasma phenomenon in the processing chamber 10B.

Thus, the method of forming a nitride film of the second embodiment is characterized by further performing the step (d) of hydrogen gas supply processing in addition to the method of forming a nitride film (steps (a) to (c)) of the first embodiment.

One example of a specific processing condition 2 according to the method of forming a nitride film of the second embodiment described above will be shown below.

Disilane gas flow rate: 0.5 sccm (standard cc/min),
Nitrogen gas flow rate: 1 slm (standard L/min),
Hydrogen gas flow rate: 10 sccm,
Wafer stage temperature: 400° C.
Processing time: 60 min,
Processing chamber pressure: 133 Pa,
Radical generator power: 100 W.

By performing the processing under the above processing condition 2, the silane-based gas reacts with nitrogen radicals, so that an about 9 nm-thick nitride film can be formed on the surface of the wafer.

The method of forming a nitride film according to the second embodiment performs the steps (a) to (c) in a similar manner to the method of forming a nitride film according to the first embodiment, so that it exhibits a similar effect to that in the first embodiment.

Furthermore, the hydrogen gas is supplied into the processing chamber 10B in the step (d) in the method of forming a nitride film of the second embodiment, it is possible to promote the reaction of the silane-based gas with the nitrogen radical gas more than the first embodiment by the supply of the hydrogen gas to thereby increase the film formation rate, and it is also possible to form a nitride film superior in insulating characteristics.

<Experimental Results>

Figure 4:
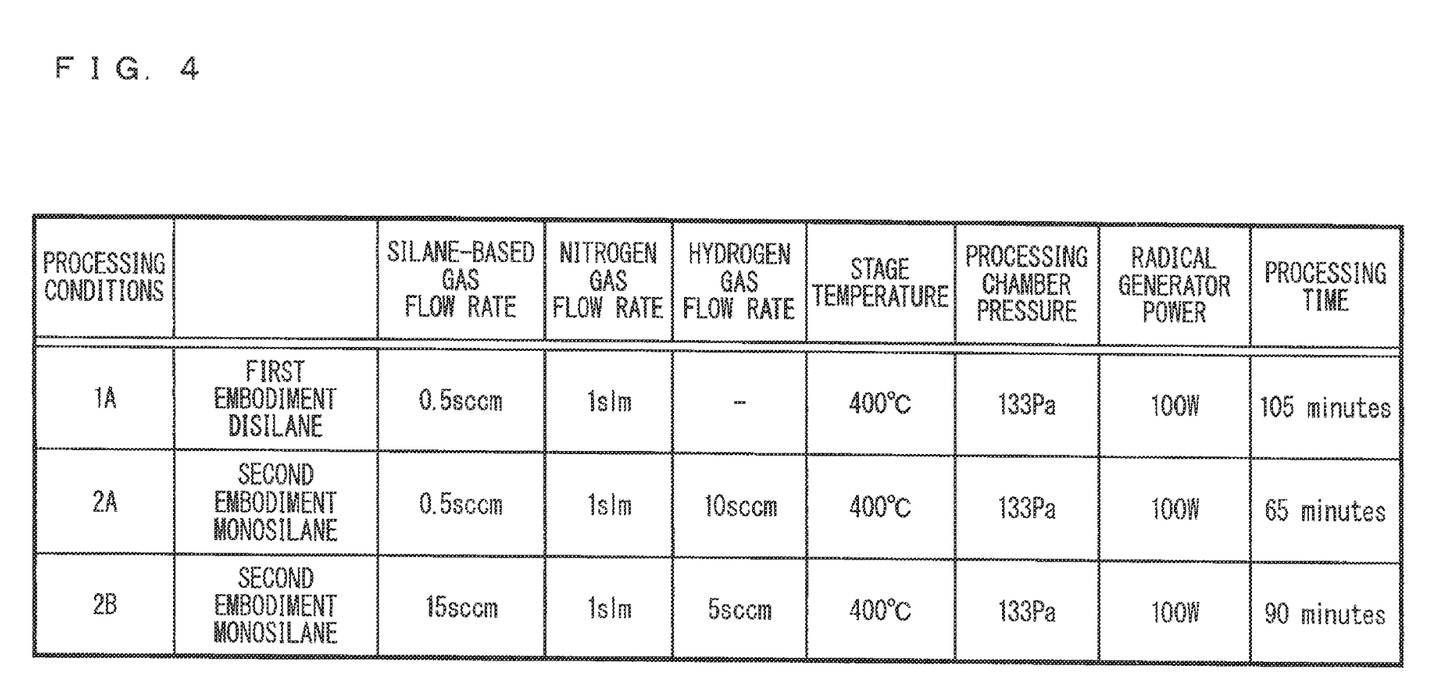
FIG. 4 is an illustration diagram tabulating processing conditions used during experiments for the methods of forming a nitride film in the first embodiment and the second embodiment.

FIG. 4 is an illustration diagram tabulating processing conditions used during experiments for the methods of forming a nitride film in the first embodiment and the second embodiment.

As shown in this figure, a processing condition 1A of the first embodiment is almost the same as the processing condition 1 described previously, and the only difference is the processing time of 105 minutes (60 minutes in the processing condition 1).

A processing condition 2A of the second embodiment is almost the same as the processing condition 2 described previously, and the only difference is the processing time of 65 minutes (60 minutes in the processing condition 2).

A processing condition 2B of the second embodiment is different from the processing condition 2 described previously in the following points. That is, the differences are that "monosilane" is used as a silane-based material ("disilane" in the processing condition 2), that the monosilane gas flow rate is "15 sccm" (0.5 sccm in the processing condition 2), that the hydrogen gas flow rate is "5 sccm" (10 sccm in the processing condition 2), and that the processing time is 90 minutes (60 minutes in the process condition 2).

Figure 5:
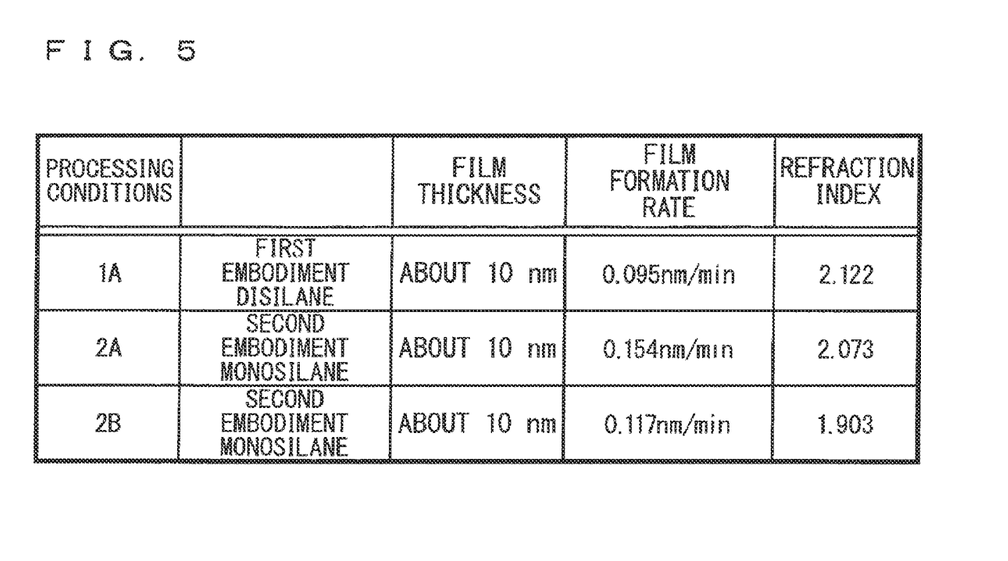
FIG. 5 is an illustration diagram tabulating experimental results (#1) of the methods of forming a nitride film in the first embodiment and the second embodiment shown in FIG. 4.

FIG. 5 is an illustration diagram tabulating experimental results (#1) of the methods of forming a nitride film in the first embodiment and the second embodiment shown in FIG. 4.

As shown in this figure, by the method of forming a nitride film in the first embodiment performed under the processing condition 1A, a nitride film having a thickness of "about 10 nm" was obtained and the film formation rate was "0.095 (nm/min)". In addition, the refractive index of the nitride film was found to be "2.122".

By the method of forming a nitride film (#1) in the second embodiment performed under the processing condition 2A, a nitride film having a thickness of "about 10 nm" was obtained and the film formation rate was "0.154 (nm/min)". In addition, the refractive index of the nitride film was found to be "2.073".

By the method of forming a nitride film (#2) in the second embodiment performed under the processing condition 2B, a nitride film having a thickness of "about 10 nm" was obtained and the film formation rate was "0.117 (nm/min)". In addition, the refractive index of the nitride film was found to be "1.903".

Figure 6:
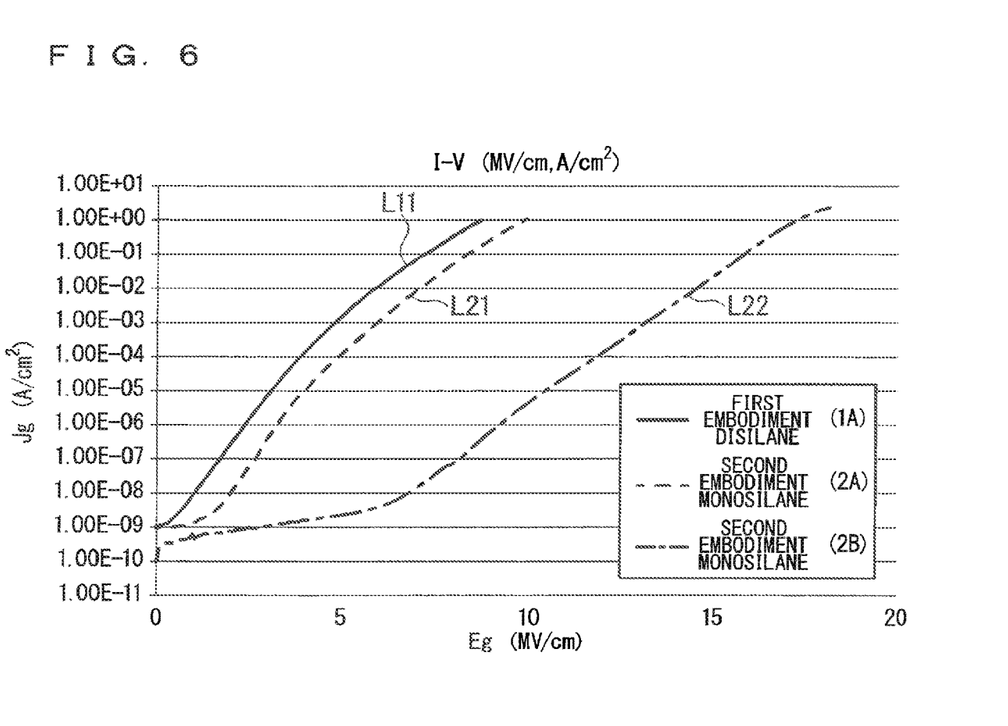
FIG. 6 is an illustration diagram tabulating experimental results (#2) of the methods of forming a nitride film in the first embodiment and the second embodiment shown in FIG. 4.

FIG. 6 is an illustration diagram tabulating experimental results (#2) of the methods of forming a nitride film in the first embodiment and the second embodiment shown in FIG. 4. In FIG. 6, the horizontal axis represents the voltage Eg (MV/cm) per unit length (cm) that is applied in the film thickness direction of a nitride film, and the vertical axis represents the leakage current Jg ($A/cm^2$) that flows per unit area ($cm^2$).

As shown in this figure, by the method of forming a nitride film in the first embodiment performed under the processing condition 1A, an insulating characteristic line L11 was obtained.

By the method of forming a nitride film (#1) in the second embodiment performed under the processing condition 2A, an insulating characteristic line L21 was obtained.

By the method of forming a nitride film (#2) in the second embodiment performed under the processing condition 2B, an insulating characteristic line L22 was obtained.

Hereinafter, "the method of forming a nitride film in the first embodiment performed under the processing condition 1A" is sometimes simply referred to as "an embodiment 1A of the first embodiment", "the method of forming a nitride film (#1) in the second embodiment performed under the processing condition 2A" is sometimes simply referred to as "the embodiment 2A of the second embodiment", and "the method of forming a nitride film (#2) in the second embodiment performed under the processing condition 2B" is sometimes simply referred to as "the embodiment 2B of the second embodiment".

As shown in FIG. 6, in any of the embodiment 1A of the first embodiment and the embodiments 2A and 2B of the second embodiment, a product has characteristics equal or superior to those of nitride films obtained by the plasma nitridation method and the thermal nitridation method. The superiority of the insulating characteristics has an order of the embodiment 2B of the second embodiment (the insulating characteristic line L22), the embodiment 2A of the second embodiment (the insulating characteristic line L21), and the embodiment 1A of the first embodiment (the insulating characteristic line L11).

Furthermore, as shown in FIG. 5, the superiority of the film formation rate has an order of the embodiment 2A of the second embodiment, the embodiment 2B of the second embodiment, and the embodiment 1A of the first embodiment.

With respect to the refractive index, a refractive index close to the refractive index 2.023 of an ideal silicon nitride film was obtained in any of the embodiment 1A of the first embodiment and the embodiments 2A and 2B of the second embodiment.

As described above, it was confirmed from the experimental results shown in FIGS. 4 to 6 that both the methods of forming a nitride film according to the first embodiment and the second embodiment could form a high-quality nitride film on the wafer 1.

Furthermore, it was confirmed from the experimental results shown in FIGS. 4 to 6 that the method of forming a nitride film in the second embodiment, the method having a hydrogen gas supply step as the step (d), could form a nitride film (a silicon nitride film) superior in insulating characteristic to the first embodiment at a higher film formation rate than the first embodiment. The insulating characteristic is one of the device characteristics related to a nitride film.

In addition, it could be confirmed that, in the second embodiment, use of monosilane rather than disilane as the silane-based gas made it possible to form a nitride film having better insulating characteristics.

From the experimental results of FIGS. 4 to 6, similarly to the second embodiment, it is presumed that use of monosilane rather than disilane as the silane-based gas makes it possible to form a nitride film having better insulating characteristics also in the first embodiment.

<Others>

In the processing conditions 1 and 1A of the first embodiment and the processing conditions 2 and 2A of the second embodiment, disilane was used as the silane-based gas (a gas composed of a compound containing silicon and hydrogen). The silane-based gas is not limited to disilane, and monosilane may be used as in the case of the processing condition 2B of the second embodiment or another silane-based gas such as trisilane may be used.

In the film formation apparatus 51 of the first embodiment shown in FIG. 1 and the film formation apparatus 52 of the second embodiment shown in FIG. 3, the radical generator 20 was disposed adjacent to the upper surface of the processing chamber 10 (10B). However, the radical generator 20 may be disposed apart from the processing chamber 10 without adjacent disposition of the processing chamber 10 and the radical generator 20, and the nitrogen radical gas 7 generated by the radical generator 20 may be supplied through piping into the processing chamber 10.

Furthermore, in the film formation apparatus 52 of the second embodiment, the hydrogen gas was supplied into the processing chamber 10 through the gas supply port 12. That is, the hydrogen gas was supplied to the processing chamber 10 independently of the silane-based gas without being added (mixed) before the supply of the silane-based gas. However, the hydrogen gas may be supplied through the gas supply port 11 in admixture with the silane-based gas.

A hydrogen radical gas may be obtained from a hydrogen gas using a configuration equivalent to the radical generator 20 to be supplied into the processing chamber 10.

While the present invention has been described in detail, the foregoing description is in all aspects illustrative, and the present invention is not limited thereto. It is understood that numerous modifications not illustrated can be devised without departing from the scope of the present invention.

Explanation of Reference Signs

The invention claimed is:

1. A method of forming a nitride film on a substrate disposed in a processing chamber, the method comprising:
    (a) supplying a silane-based gas to said processing chamber;
    (b) supplying a nitrogen radical gas to said processing chamber; and
    (c) reacting the silane-based gas supplied in (a) with the nitrogen radical gas supplied in (b), without causing a plasma phenomenon in said processing chamber, to form a nitride film on said substrate, wherein
    in said reacting (c), heating treatment of heating a surface of said substrate to a temperature equal to or higher than a temperature at which the silane-based gas decomposes is further performed, and
    said supplying (b) includes generating a nitrogen radical gas from a nitrogen gas in a radical generator disposed separately from said processing chamber and supplying the nitrogen radical gas to said processing chamber.

2. The method of claim 1, further comprising:
    (d) supplying hydrogen to said processing chamber.

3. The method of claim 1, wherein
    the nitrogen radical gas is generated in a state of 400° C. or lower by heating said radical generator.

4. The method of claim 3, wherein
    said radical generator obtains the nitrogen radical gas by forming a discharge space between a pair of electrodes facing each other via a dielectric, applying an AC voltage to between said pair of electrodes to generate a dielectric barrier discharge in said discharge space, and allowing the nitrogen gas to pass through said discharge space.

* * * * *